United States Patent
Choi et al.

(10) Patent No.: US 9,426,909 B2
(45) Date of Patent: Aug. 23, 2016

(54) DISPLAY APPARATUS WITH A DETACHABLE GLASS PLATE

(71) Applicant: SAMSUNG ELECTRONICS CO., LTD., Suwon-si (KR)

(72) Inventors: Hyun Yong Choi, Chuncheon-si (KR); Bong Joo Kim, Hwaseong-si (KR); Jae Hoo Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 571 days.

(21) Appl. No.: 13/753,780

(22) Filed: Jan. 30, 2013

(65) Prior Publication Data
US 2013/0194749 A1    Aug. 1, 2013

(30) Foreign Application Priority Data

| Jan. 30, 2012 | (KR) | 10-2012-0009005 |
| Jan. 30, 2012 | (KR) | 10-2012-0009123 |
| Aug. 6, 2012  | (KR) | 10-2012-0085835 |

(51) Int. Cl.
*H05K 5/02* (2006.01)
*G02F 1/1333* (2006.01)
*G06F 1/16* (2006.01)

(52) U.S. Cl.
CPC ....... *H05K 5/0239* (2013.01); *G02F 1/133308* (2013.01); *H05K 5/0226* (2013.01); *G02F 2001/133325* (2013.01); *G02F 2001/133331* (2013.01); *G06F 1/1601* (2013.01)

(58) Field of Classification Search
None
See application file for complete search history.

(56) References Cited

U.S. PATENT DOCUMENTS

| 6,151,083 | A  | * | 11/2000 | Hung ............................ 348/818 |
| 7,495,846 | B1 | * | 2/2009  | Kappel ......................... 359/802 |
| D612,818  | S  | * | 3/2010  | Lents, Jr. ..................... D14/125 |
| 8,437,124 | B2 | * | 5/2013  | Dai ............................ 361/679.24 |
| 8,511,626 | B1 | * | 8/2013  | Trinh et al. ................. 248/206.2 |
| 8,885,110 | B1 | * | 11/2014 | St. Clair ....................... 348/836 |
| 2008/0030631 | A1 | | 2/2008 | Gallagher |
| 2011/0075342 | A1 | * | 3/2011 | Gotham et al. .......... H05K 5/02 361/679.21 |

FOREIGN PATENT DOCUMENTS

| CN | 1875334 A | 12/2006 |
| JP | 2005-227539 A | 8/2005 |
| KR | 10-2010-0004007 A | 1/2010 |

OTHER PUBLICATIONS

Communication, dated Jun. 21, 2013, issued by the European Patent Office in counterpart European Patent Application No. 13152955.4.
Communication dated Mar. 3, 2016, issued by the State Intellectual Property Office of the People's Republic of China in counterpart Chinese Application No. 201310036658.3.

* cited by examiner

*Primary Examiner* — Courtney Smith
(74) *Attorney, Agent, or Firm* — Sughrue Mion, PLLC

(57) ABSTRACT

A display apparatus including a glass plate detachably mounted to facilitate after-sales service (A/S) for repair or replacement of the glass plate and reduce A/S time is provided.
The display apparatus includes a display which displays an image; a glass detachably mounted on the front surface of the display; and a pivotable holder provided at the glass to detachably mount the glass to the display.

8 Claims, 15 Drawing Sheets

DISPLAY APPARATUS WITH A DETACHABLE GLASS PLATE

CROSS-REFERENCE TO RELATED APPLICATION(S)

This application claims the benefit of Korean Patent Application No. 2012-0009005, filed on Jan. 30, 2012, Korean Patent Application No. 2012-0009123, filed on Jan. 30, 2012, and Korean Patent Application No. 2012-0085835, filed on Aug. 6, 2012 in the Korean Intellectual Property Office, the disclosure of which is incorporated herein by reference, in its entirety.

BACKGROUND

1. Field

Exemplary embodiments of the inventive concept relate to a display apparatus including a glass plate.

2. Description of the Related Art

In general, a "display apparatus" is a comprehensive term which generally refers to a variety of devices which visually display data on a display using text or figures.

Particularly, the application of liquid crystal display (LCD) devices, as a flat panel display device, is expanding to computer monitors and TVs, and there is increasing demand for such LCD devices.

Display apparatuses are classified into various types according to plural methods of displaying signal-processed image information on a screen. Recently, liquid crystal displays (LCDs) and plasma display panels (PDPs) have become widely used.

A display apparatus includes a display panel which displays an image, a glass plate mounted on the front surface of the display panel, a front disposed at an edge portion of the glass plate and the display panel to constitute a bezel and functioning as a frame which supports the glass plate and the display panel, and a casing which supports the back of the display and constituting an external body.

However, since the glass plate is attached to the display panel in such display apparatuses, disassembly of the entire display apparatus is required for repair or replacement of the glass plate. Thus, after-sales service (A/S) time therefore increases.

In addition, since the glass plate is provided at an inner portion of the bezel, the thickness of the bezel increases.

SUMMARY

Therefore, it is an aspect of the inventive concept to provide a display apparatus having a display including a detachable glass plate.

It is another aspect of the inventive concept to provide a display apparatus including a detachable glass plate to facilitate A/S for repair and replacement of the glass plate.

It is a further aspect of the inventive concept to provide a display apparatus with a wide ranging product group by manufacturing two types of display apparatuses including display apparatuses provided with a glass plate and display apparatuses not provided with a glass plate.

Additional aspects of the inventive concept will be set forth in part in the description which follows and, in part, will be obvious from the description, or may be learned by practice of the invention.

In accordance with one aspect of the inventive concept, a display apparatus includes a display displaying an image, a glass detachably mounted on the front surface of the display, and a holder provided at the glass to detachably mount the glass on the display.

The holder may include a hinge which is rotatably installed at the glass and a fixing device which extends from the hinge to fix the display in place.

The glass may include a glass plate and a frame which surrounds peripheral portions of the glass plate; and the frame may include a holder installation portion to which the hinge is coupled.

The holder installation portion may have guide grooves formed outward from the inside of the frame and may have hinge grooves which extend from the guide grooves in a horizontal direction of the frame.

The hinge may have a hinge protrusion which protrudes so as to be coupled to the hinge groove.

The display may include a display panel displaying an image; a bezel disposed at an outer peripheral portion of the display panel; a back case coupled to the rear surface of the display panel, and the back case may have a first coupling portion to which the holder is fixed.

The fixing device of the holder may have a second coupling portion which corresponds to the first coupling portion in order to fix together the glass and the display.

The first coupling portion and the second coupling portion may include a protrusion or a recess.

In accordance with another aspect of the inventive concept, a display apparatus includes a display a display which displays an image and a glass detachably mounted on the front surface of the display.

The display apparatus may further include a holder which couples the glass and the display to detachably mount the glass on the display.

The holder may include a hinge having a hinge protrusion which is rotatably installed at the glass and a fixing device which extends from the hinge to fix the display.

The display may include a display panel which displays an image; a bezel disposed at an outer peripheral portion of the display panel; a back case coupled to the rear surface of the display panel, and the back case may have a coupling groove to which the holder is fixed.

The fixing device may have a coupling protrusion which corresponds to the coupling groove to fix together the glass and the display.

The glass may include a glass plate and a frame which surrounds peripheral portions of the glass plate, and the frame may have a holder installation portion to which the hinge is coupled.

The holder installation portion may have guide grooves formed outward from the inside of the frame and hinge grooves which extends from the guide grooves in a horizontal direction of the frame.

In accordance with another aspect of the inventive concept, a display apparatus includes a housing having openings at the front and rear surfaces thereof, a glass disposed at the front surface of the housing unit, a back cover disposed at the rear surface of the housing, a display disposed in the housing behind the glass and displaying an image, and a waterproof device disposed between the housing and the glass to prevent moisture from being introduced into the housing.

The waterproof device may include a glass holder fixed to the glass and rubber provided on the glass holder.

The waterproof device may further include a waterproof bracket provided at the housing to contact the rubber.

The glass holder may include a supporter attached to the rear surface of the glass, a rubber attachment portion to which the rubber is attached, and a coupling portion to be coupled with the housing.

The waterproof device may be provided at a frame of the rear surface of the glass.

The waterproof device may be disposed between the housing and the back cover.

The waterproof device may further include rubber disposed at a frame of the back cover and a waterproof bracket formed at the housing to contact the rubber.

The waterproof bracket may include a first waterproof bracket provided at the back cover to contact the rubber and a second waterproof bracket surrounding an outer portion of the first waterproof bracket.

The waterproof unit may be disposed at frames of the housing and the back cover.

The back cover may include an inlet through which air is introduced and an outlet through which air is discharged, and the display apparatus may further include an air circulator which cools the display by circulating air introduced through the inlet and discharging the air through the outlet.

The air circulator may include a blower fan which removes heat generated in the display.

In accordance with another aspect of the inventive concept, a display apparatus includes a housing having openings at the front and rear surfaces thereof, a glass disposed at the front surface of the housing unit, a display disposed in the housing behind the glass and displaying an image, a back cover disposed at the rear surface of the housing and includes an inlet through which air is introduced and an outlet through which air is discharged, an air circulator which cools the display by circulating air introduced through the inlet and discharging the air through the outlet, and waterproof devices disposed between the housing and the glass and between the housing and the back cover to prevent moisture from being introduced into the housing.

The waterproof device may be rubber.

The waterproof device may include a glass holder fixed to the glass, rubber disposed at the glass holder, and a waterproof bracket provided at the housing to contact the rubber.

The glass holder may include a supporter which is attached to the rear surface of the glass, a rubber attachment portion to which the rubber is attached, and a coupling portion coupled with the housing.

The coupling portion of the glass holder may be coupled with the waterproof bracket of the housing.

The waterproof device may further include rubber disposed at a frame of the back cover and a waterproof bracket formed at the housing to contact the rubber.

An exemplary embodiment may include a display apparatus with a detachable glass plate having: a glass detachably mounted on a front surface of a display; and a pivotable holder provided at the glass which detachably mounts the glass on the display. The pivotable holder may include a hinge portion having a hinge protrusion which corresponds with a hinge groove formed in a frame of the glass. The pivotable holder may include a coupling which corresponds with a coupling of a back case of the display.

BRIEF DESCRIPTION OF THE DRAWINGS

These and/or other aspects of the inventive concept will become apparent and more readily appreciated from the following description of the exemplary embodiments, taken in conjunction with the accompanying drawings of which.

DETAILED DESCRIPTION

Figure 1:
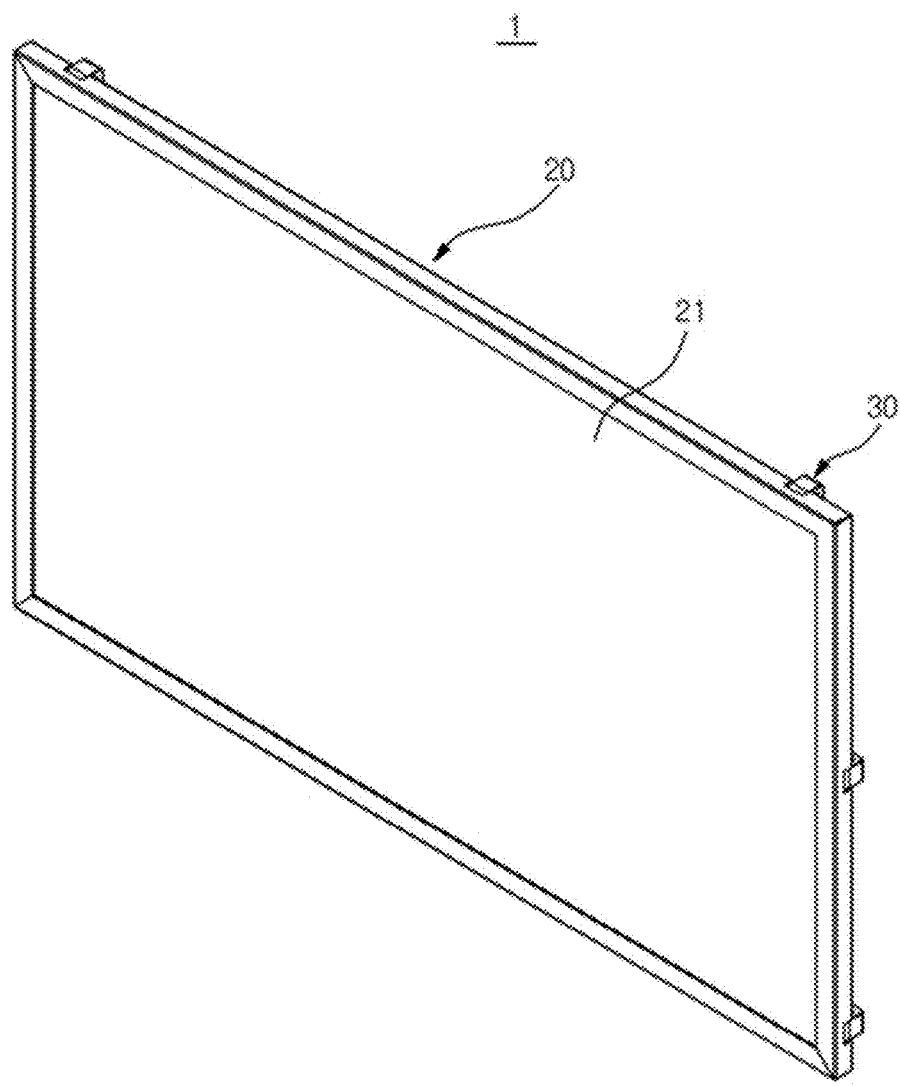
FIG. 1 is a perspective view schematically illustrating the front of a display apparatus 1 according to an exemplary embodiment of the inventive concept.

Reference will now be made in detail to the exemplary embodiments of the inventive concept, examples of which are illustrated in the accompanying drawings, wherein like reference numerals refer to like elements throughout.

Figure 2:
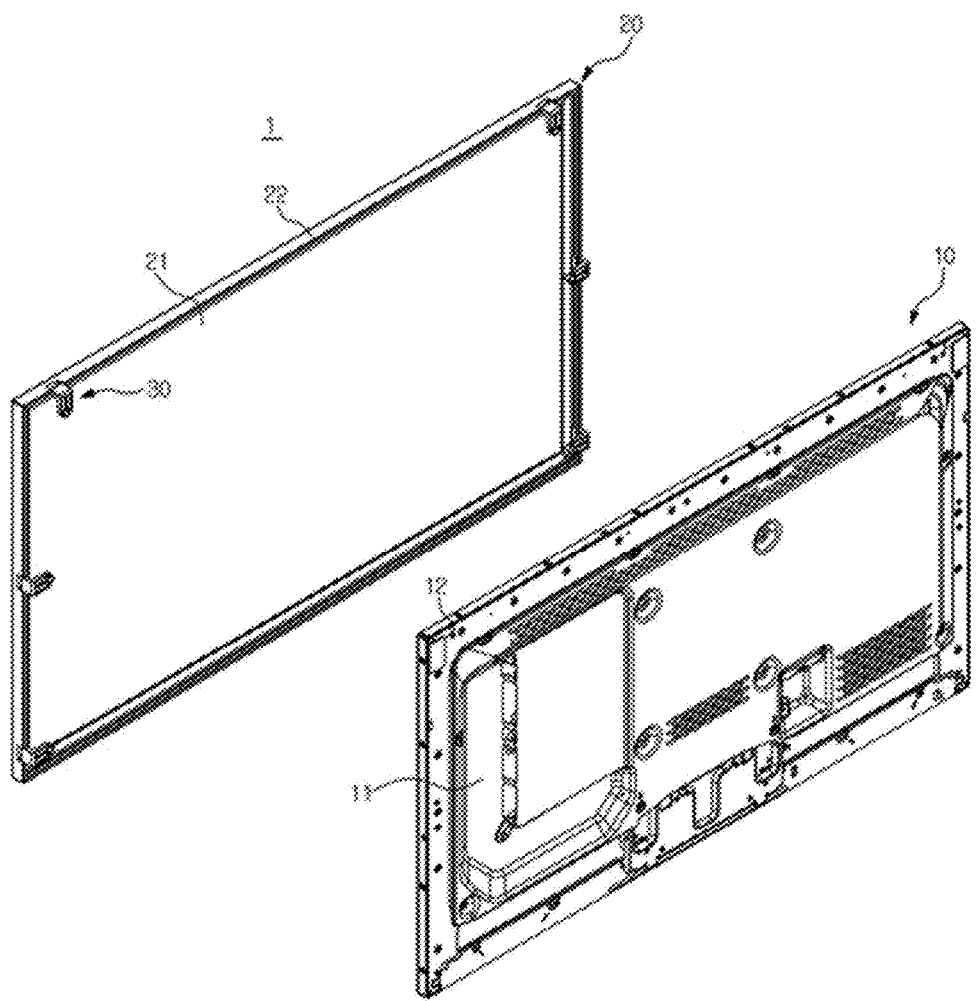
FIG. 2 is a perspective view schematically illustrating a glass and a display of a display apparatus according to an exemplary embodiment of the inventive concept.

FIG. 1 is a perspective view which schematically illustrates the front of a display apparatus 1 according to an exemplary embodiment of the inventive concept. FIG. 2 is a perspective view which schematically illustrates a glass and a display of the display apparatus.

Figure 3:
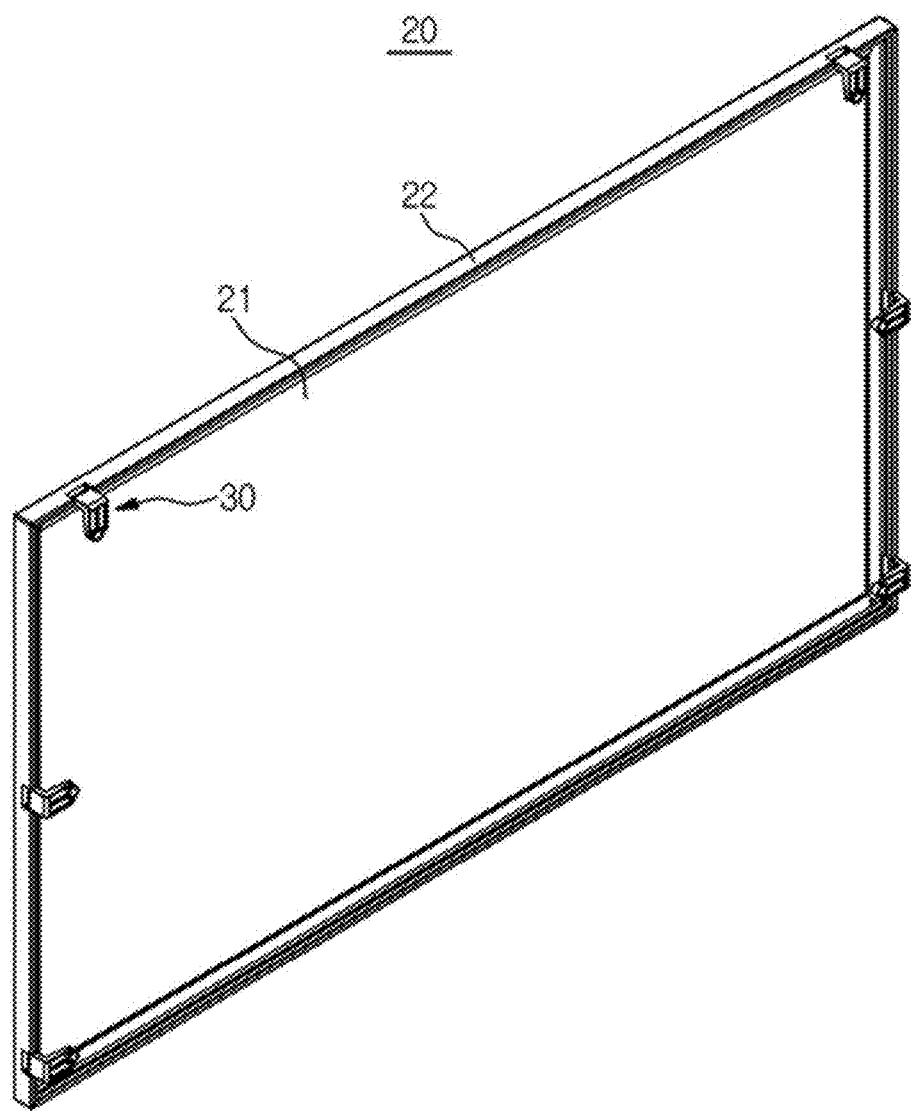
FIG. 3 is a perspective view schematically illustrating a glass of a display apparatus according to an exemplary embodiment of the inventive concept.

As shown in FIGS. 1 to 3, the display apparatus 1 includes a display 10 displaying image information and a glass 20 which is detachably mounted on the front surface of the display 10 to protect the display 10.

Generally, the display 10 includes a display panel (not shown) which displays image information, a bezel (not shown) disposed at an outer peripheral portion of a frame of the display panel, and a back case 11 which is connected to the rear surface of the display panel in order to support the display panel.

The glass 20 includes a glass plate 21 and a frame 22 surrounding peripheral portions of the glass plate 21. The frame 22 includes a holder 30 which couples the glass to the display 10.

The frame 22 of the glass 20 may include a plurality of holders 30 such that each of the four sides of the frame 22 includes at least one holder 30.

In addition, the back case 11 of the display 10 has a first coupling portion 12 to which the holder 30 is coupled.

A first coupling portion 12 may be formed to correspond to the position and number of the holder 30.

Figure 4:
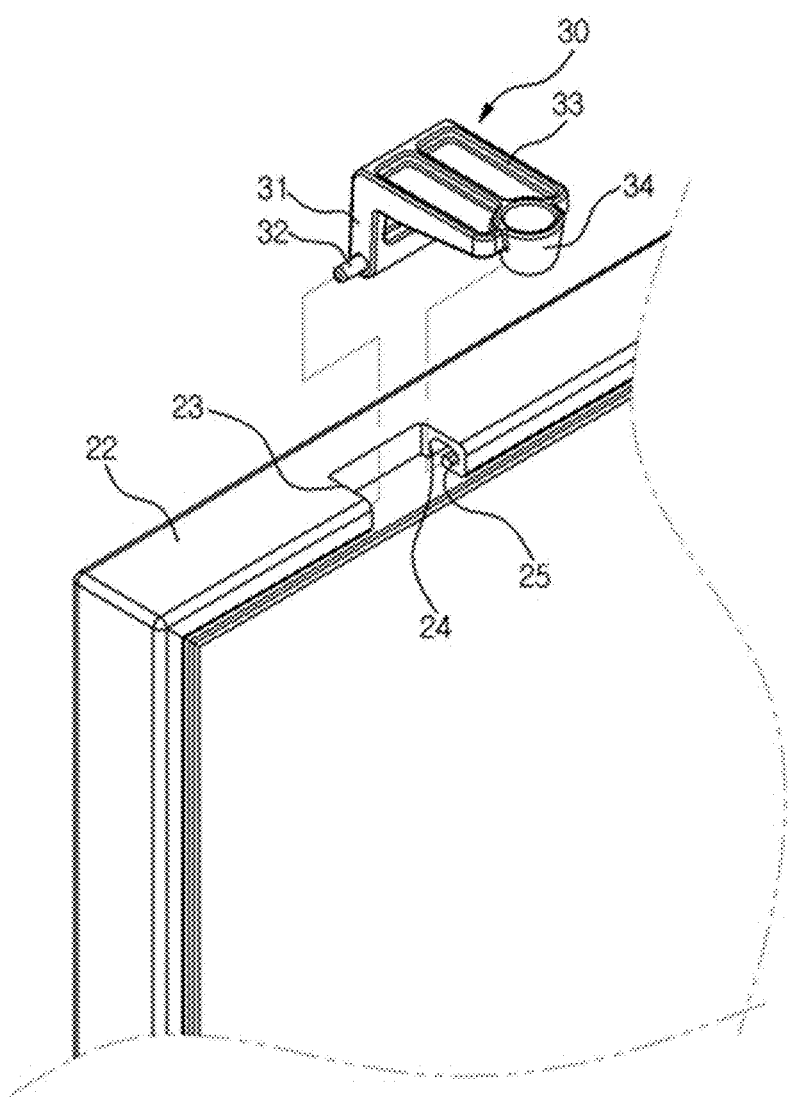
FIG. 4 is a schematic diagram illustrating a holder provided at a glass according to an exemplary embodiment of the inventive concept.
Figure 5:
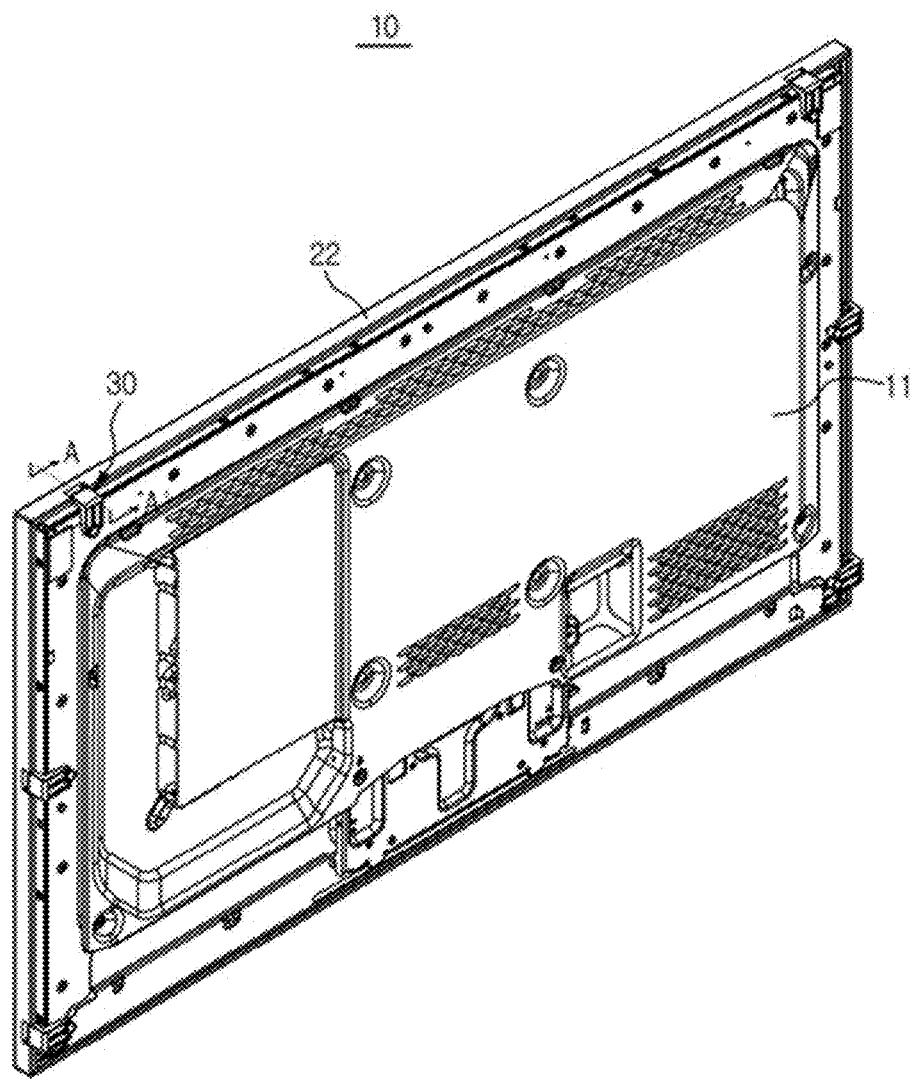
FIG. 5 is a perspective view schematically illustrating a glass mounted on a display by a holder according to an exemplary embodiment of the inventive concept.
Figure 6:
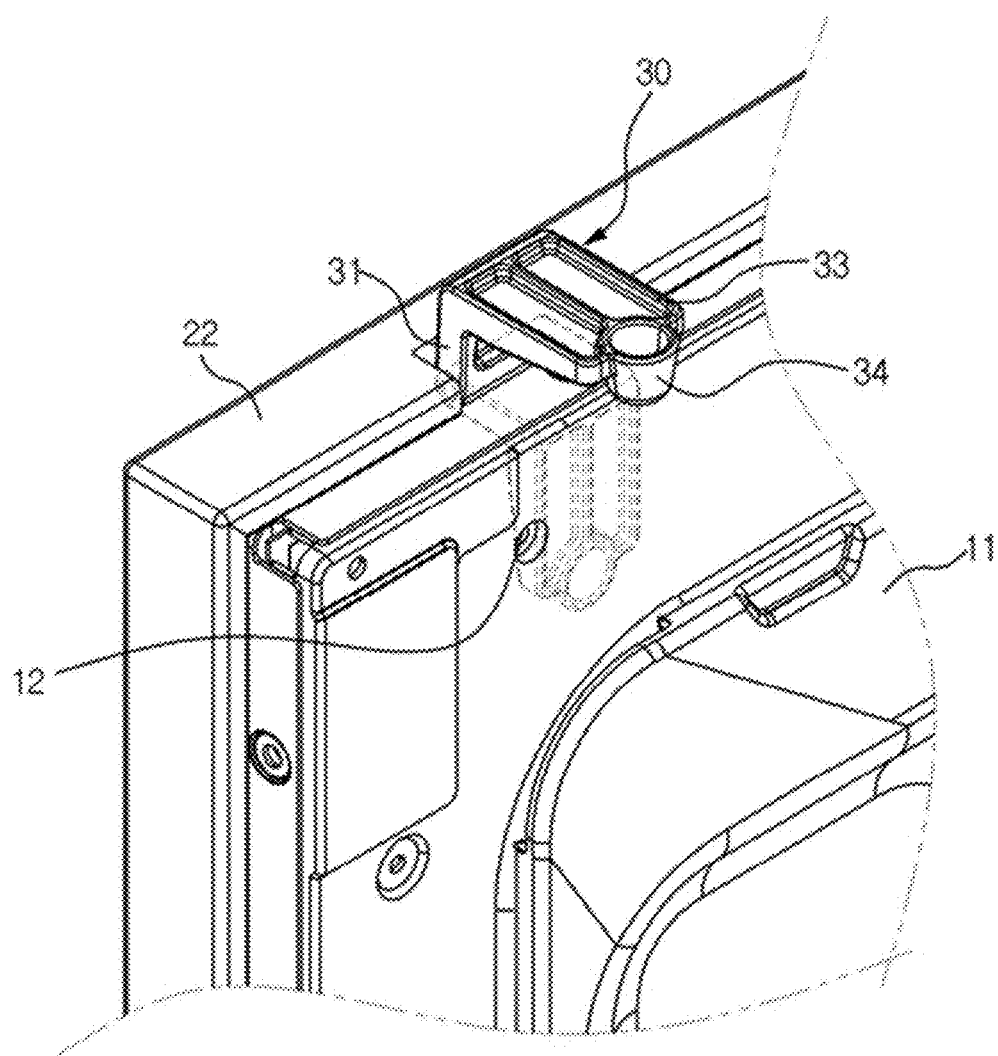
FIG. 6 is a schematic diagram illustrating operation of a holder according to an exemplary embodiment of the inventive concept.

FIG. 4 schematically illustrates the holder 30 provided at the glass 20. FIG. 5 schematically illustrates the glass 20 mounted on the display 10 by the holder unit. FIG. 6 schematically illustrates operation of the holder 30.

As shown in FIG. 4, the frame 22 of the glass 20 has a holder installation portion 23, to which the holder 30 is coupled.

In addition, the holder 30 includes a hinge 31 which is rotatably installed at the glass 20 and a fixing device 33 extending from the hinge 31 which fixes the glass 20 to the display 10.

The holder 30 has an "L" shape, and the fixing device 33 is bent from the hinge 31.

The hinge 31 includes hinge protrusions 32 at both ends thereof.

The holder installation portion 23 of the glass 20 has guide grooves 24 formed outward from the inside of the frame 22 to which the hinge protrusions 32 of the hinge 31 are coupled and hinge grooves 25 extending from the guide grooves 24 in the horizontal direction of the frame 22.

In this regard, the guide grooves 24 may have a diameter greater than that of the hinge protrusions 32 such that the guide grooves 24 guide the movement and rotation of the hinge protrusions 32 during installation of the holder 30, and the hinge grooves 25 may have the same diameter as that of the hinge protrusions 32 in order to fix the holder 30 to the frame 22.

Thus, the holder 30 is assembled into the upper side of the frame 22 by assembling the hinge protrusions 32 of the hinge 31 into the guide grooves 24 of the holder installation portion 23 formed at the upper side of the frame 22 of the glass 20, for example, by moving the hinge protrusions 32 upward from the lower portions of the guide grooves 24 formed at the upper side of the frame 22 of the glass 20 and installing the hinge protrusions 32 into the hinge grooves 25 extending from the guide grooves 24 in the horizontal direction as shown in FIG. 4. By rotating the hinge protrusions 32 installed at the hinge grooves 25, the glass 20 may be coupled with the display 10.

In addition, the holder 30 is assembled into a left or right side of the frame 22 by moving the hinge protrusions 32 to the guide grooves 24 formed at the left or right side of the frame 22 and installing the hinge protrusions 32 into the hinge grooves 25 which extend from the guide grooves 24. By rotating the hinge protrusions 32 installed at the hinge grooves 25 in the transverse direction, the glass 20 may be coupled with the display 10.

A second coupling portion 34 is formed at one end of the fixing device 33 of the holder 30. The second coupling portion 34 may be a cylindrical protrusion.

In addition, the second coupling portion 34 is coupled with the first coupling portion 12 disposed at the back case 11 to correspond with the second coupling portion 34 of the holder 30.

In this regard, the first coupling portion 12 may be a cylindrical recess such that the cylindrical protrusion of the second coupling portion 34 is contained in the first coupling portion 12.

Here, the first coupling portion 12 has the recess and the second coupling portion 34 has the protrusion. However, the first coupling portion 12 and the second coupling portion 34 may be coupled with each other in various ways, in addition to using the cylindrical protrusion and recess shown in the exemplary embodiment.

As shown in FIG. 6, when the holder 30 hinge-fixed to the holder unit installation portion 23 of the glass 20 is rotated downward, the second coupling portion 34 provided at the fixing device 33 of the holder 30 is coupled with the first coupling portion 12 provided at the back case 11 of the display 10.

Figure 7:
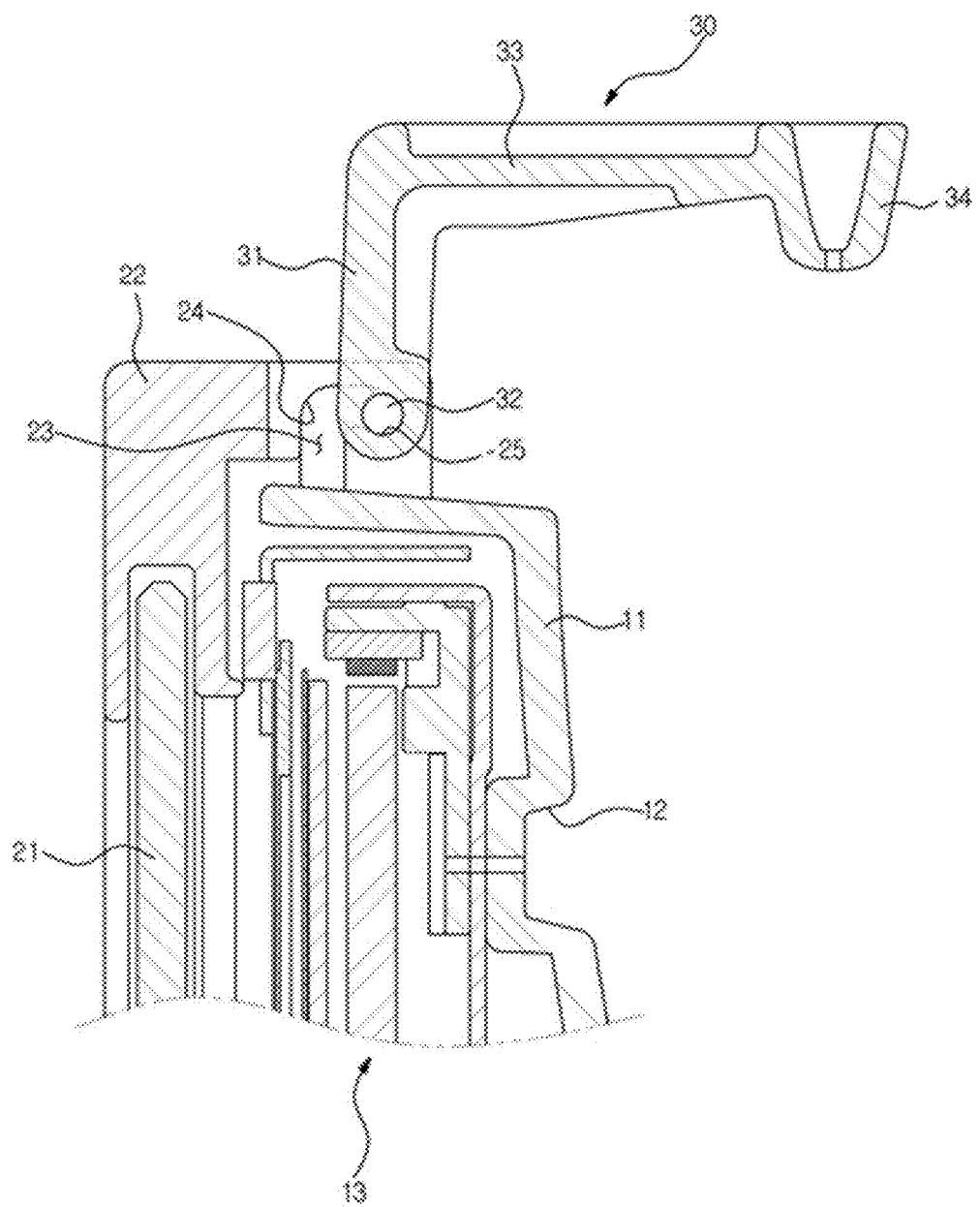
FIGS. 7 and 8 are cross-sectional views illustrated in FIG. 5 taken along line A-A' schematically illustrating opening and closing operations of a holder according to an exemplary embodiment of the inventive concept.
Figure 8:
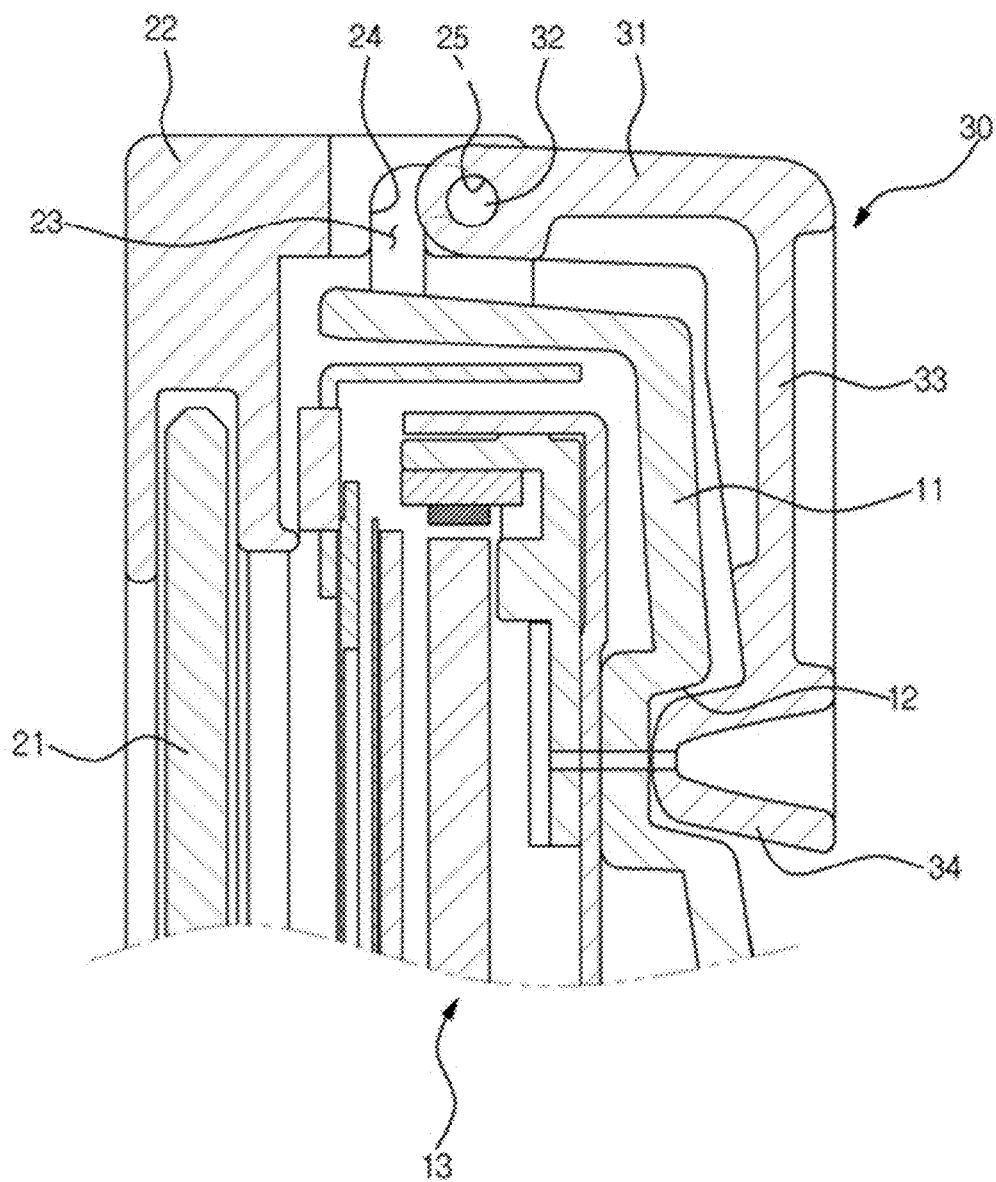

Referring to FIGS. 7 and 8, an example of opening and closing operations of the holder 30 will be described in detail.

For assembly of the glass 20 and the display 10, which are separately formed, the glass 20 and the display 10 are disposed at predetermined positions.

In this regard, the holder 30 installed in the holder installation portion 23 of the frame 22 of the glass 20 may be disposed such that the fixing device 33 of the holder 30 is raised upward. Here, the hinge protrusions 32 of the hinge 31 are fixed to the hinge grooves 25.

When the display 10 is disposed on the glass 20 to be assembled, the holder 30 is rotated downwardly from the raised position to couple the second coupling portion 34 of the fixing device 33 with the first coupling portion 12 provided at the back case 11 of the display panel 10.

When a plurality of holder 30 provided at the frame 22 of the glass 20 is fixed to the back case 11, the glass 20 and the display 10 are fixed to each other.

In addition, when the glass 20 is separated from the display 10, the second coupling portion 34 of the fixing device 33 of the holder 30 is separated from the first coupling portion 12 of the back case 11 by rotating the holder 30 upward.

When all of the holders 30 of the frame 22 of the glass 20 are separated, the glass 20 is easily separated from the display 10.

Since the glass 20 is detachably coupled with the display 10 as described above, A/S of the glass plate 21 for repair and replacement thereof may be facilitated. Accordingly, A/S time may be reduced.

Figure 9:
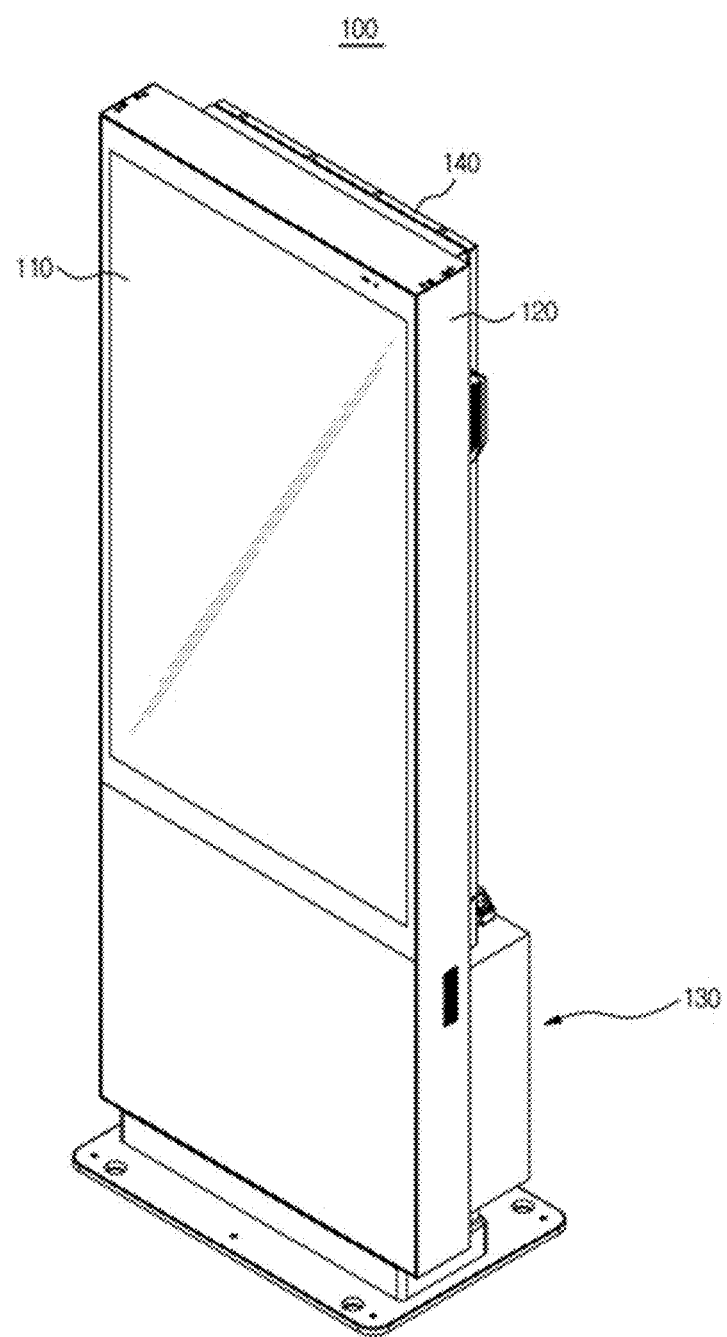
FIG. 9 is a perspective view illustrating the front of a display apparatus according to another exemplary embodiment of the inventive concept.
Figure 10:
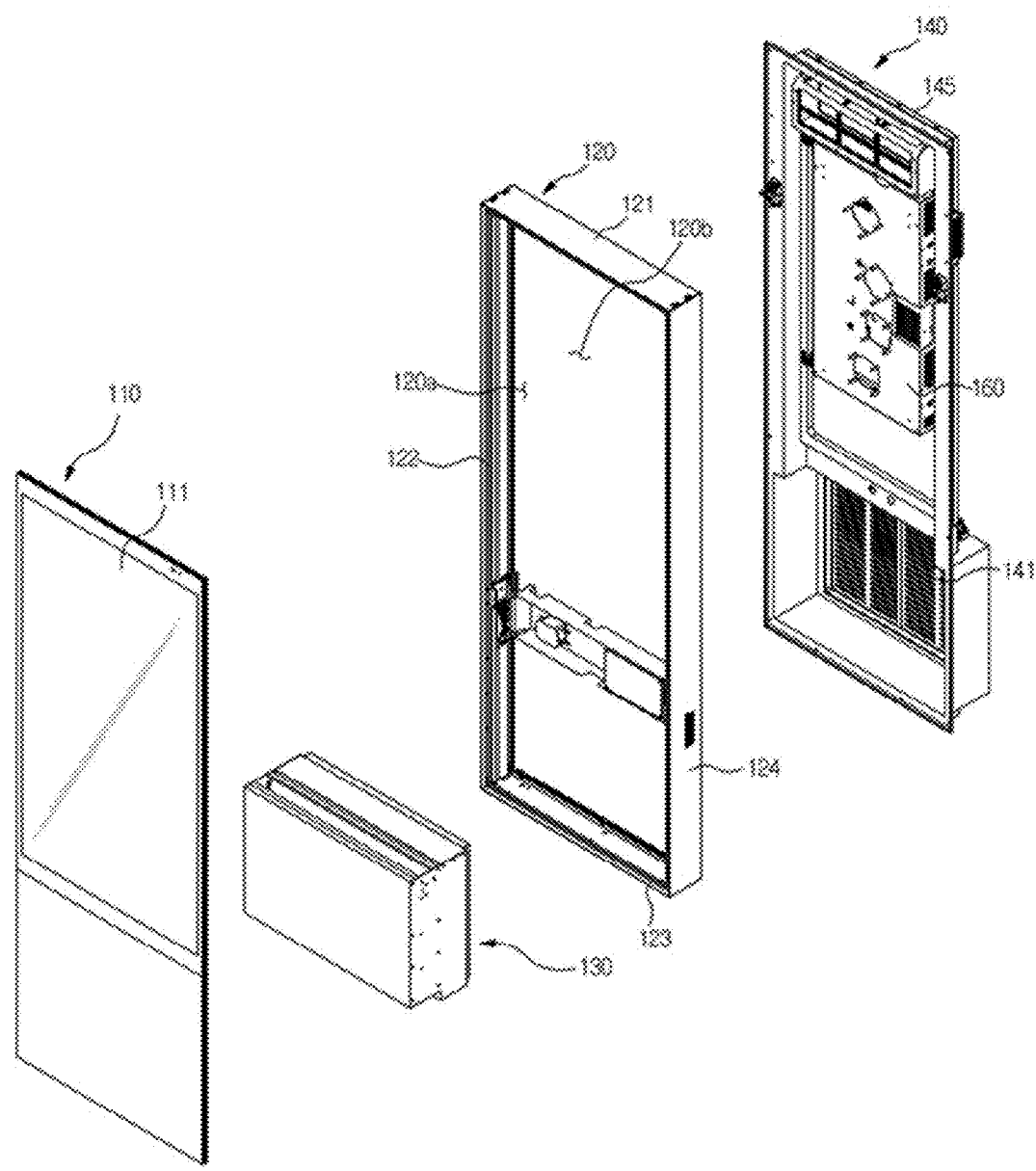
FIG. 10 is an exploded perspective view schematically illustrating a display apparatus according to another exemplary embodiment of the inventive concept.

Referring to FIGS. 9 and 10, a display apparatus 100 according to another exemplary embodiment of the inventive concept includes a housing 120 which constitutes the appearance of the display apparatus 100 and including a front opening 120a and a rear opening 120b respectively at the front and rear surfaces thereof, a glass 110, disposed at the front opening 120a of the housing 120, a back cover 140 implemented to constitute the back appearance of the housing 120, and a display 160 disposed in the housing 120.

The housing 120, which has a rectangular shape having the front opening 120a and the rear opening 120b, includes a first panel 121 which constitutes the upper surface, a third panel 123 which constitutes the lower surface to support the bottom, and a second panel 122 and a fourth panel 124 disposed both side surfaces connecting the first panel 121 and the third panel 123.

The glass 110 disposed at the front opening 120a of the housing 120 may be formed of a transparent material with sufficient rigidity. According to the exemplary embodiment, the glass 110 may include a glass plate 111 or tempered glass having a size and shape which correspond to the front opening 120a of the housing 120.

The display 160 which displays an image is disposed in the housing 120 behind the glass plate 111 such that the image displayed on the display 160 may be viewed from the outside.

Although not shown in the drawings, the display 160 may include a liquid crystal panel displaying an image, a backlight disposed behind the liquid crystal panel and emitting light to the liquid crystal panel, and a controller disposed behind the backlight, including a circuit board, and controlling operations of the liquid crystal panel and the backlight.

The back cover 140 includes an inlet 141 disposed at a lower portion thereof through which air is introduced and an outlet 145 disposed at an upper portion thereof through which the air introduced via the inlet 141 is discharged.

An air circulator 130 may further be disposed at a lower portion of the back cover 140 in order to cool the display 160.

The display apparatus 100, which may be installed outdoors, may be heated by sunlight transmitted through the glass 110 disposed at the front surface, and accordingly, the interior of the display apparatus 100 may become deteriorated.

Thus, the display apparatus 100 may include the air circulator 130 that keeps the temperature of the interior of the display apparatus 100 within a predetermined range by circulating air introduced from the outside into the housing 120.

In addition, external water or dust may be introduced into the display apparatus 100 when installed outdoors. Thus, the display apparatus 100 according to the exemplary embodiment may include a waterproof device 150 to prevent external water or dust from being introduced thereinto.

Figure 11:
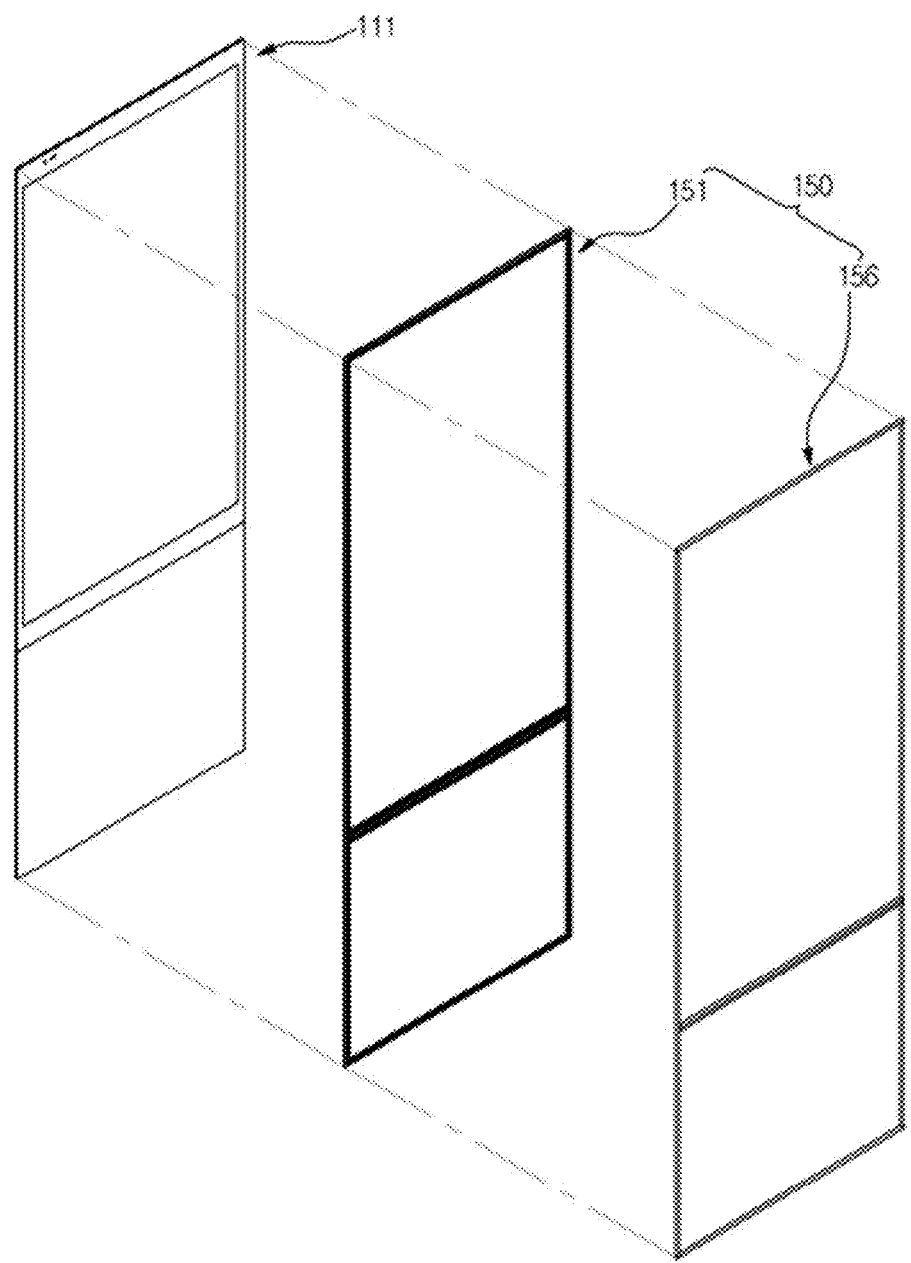
FIG. 11 is a perspective view schematically illustrating a glass of a display apparatus according to another exemplary embodiment of the inventive concept to which a waterproof device is provided.
Figure 12:
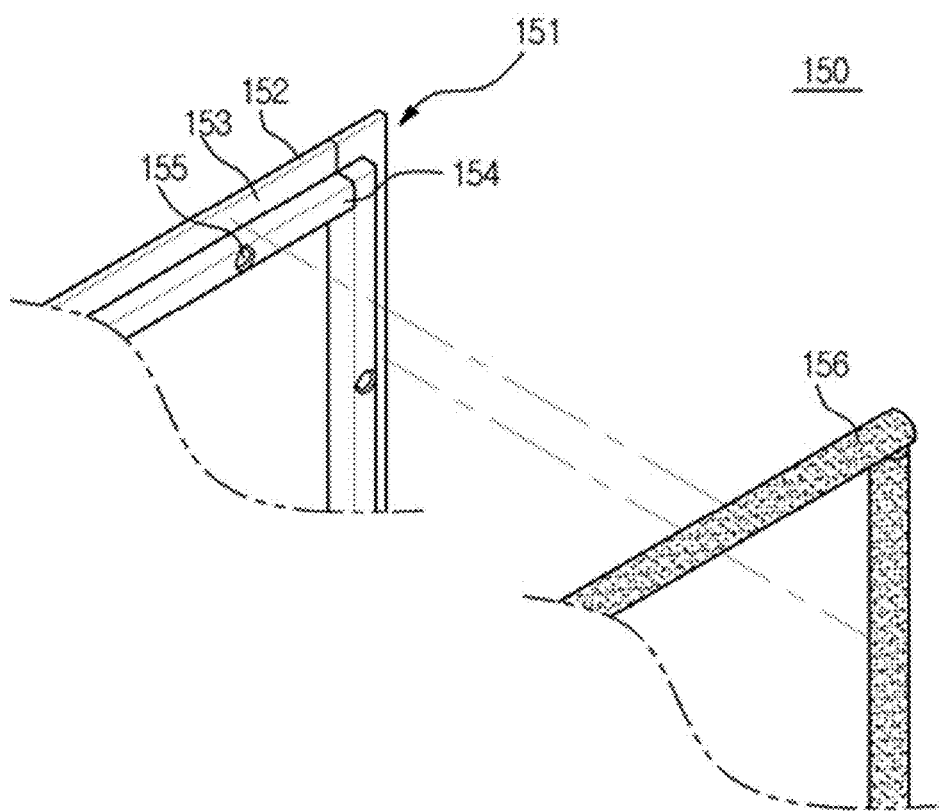
FIG. 12 is a schematic diagram illustrating a waterproof device provided to a glass according to another exemplary embodiment of the inventive concept.
Figure 13:
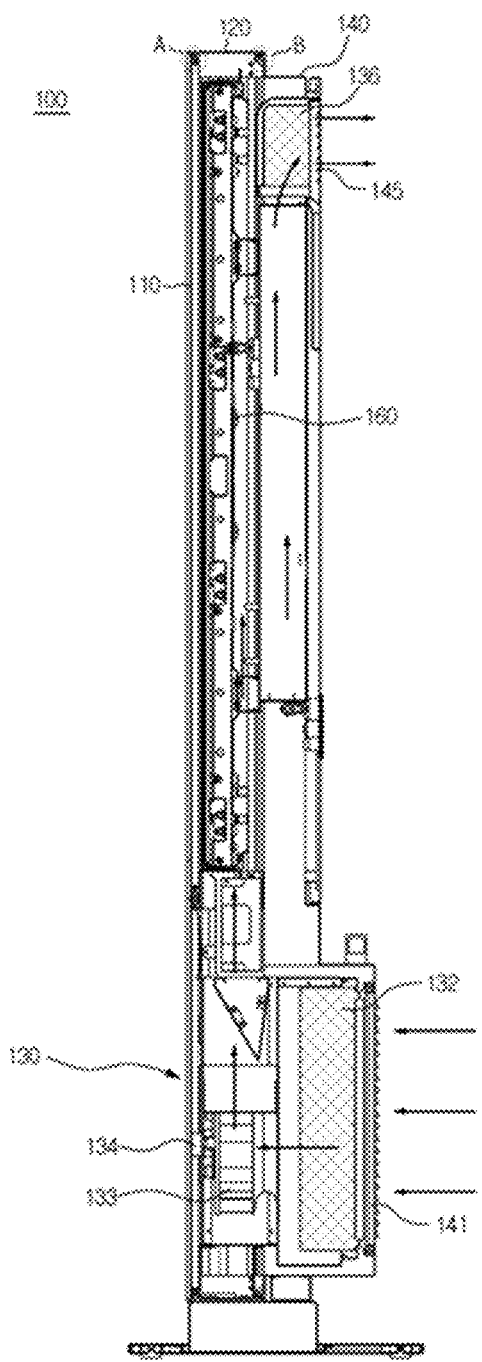
FIG. 13 is a cross-sectional view schematically illustrating a display apparatus according to an exemplary embodiment of the inventive concept.
Figure 14:
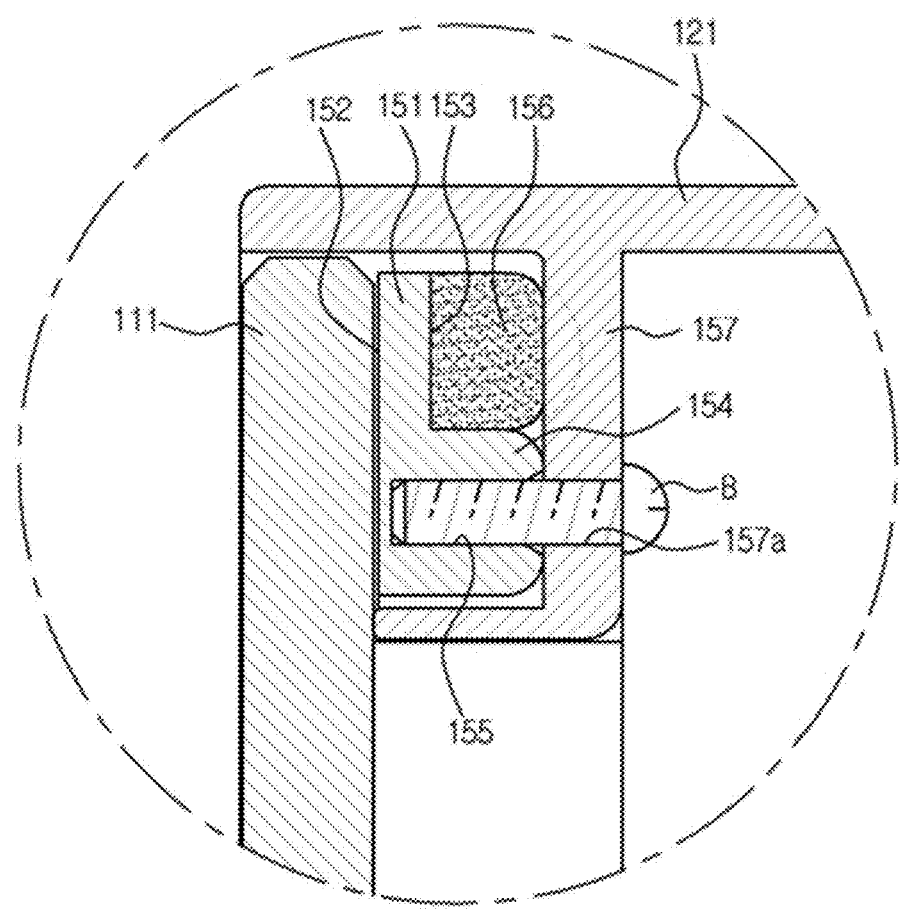
FIG. 14 is an enlarged view illustrating portion "A" of FIGS. 13.
Figure 15:
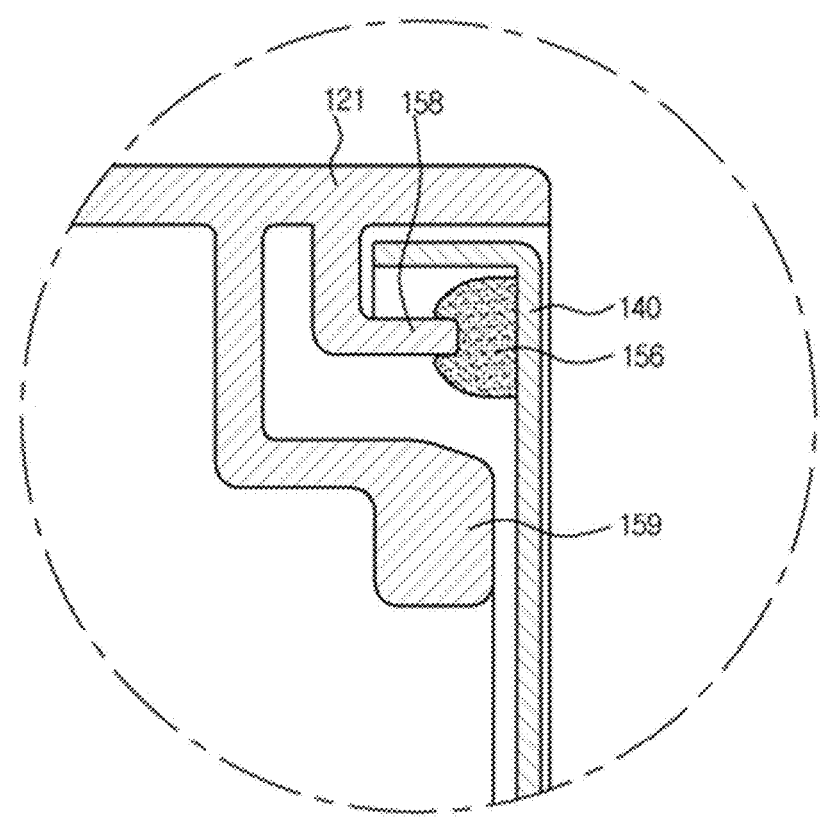
FIG. 15 is an enlarged view illustrating portion "B" of FIG. 13.

FIG. 11 schematically illustrates the glass of 110 of the display apparatus 100 on which a waterproof device 150 is mounted. FIG. 12 schematically illustrates the waterproof device 150 provided to the glass 110. FIG. 13 is a cross-sectional view schematically illustrating the display apparatus 100. FIG. 14 is an enlarged view illustrating portion "A" of FIG. 12. FIG. 15 is an enlarged view illustrating portion "B" of FIG. 12.

As shown in FIG. 11, the waterproof devices 150 are disposed between the housing 120 and the glass 110 and between the housing 120 and the back cover 140.

The waterproof device 150 includes a glass holder 151 fixed to the glass 110 and rubber 156 provided at the glass holder 151.

The glass holder 151 includes a supporter 152 attached to a frame of the rear surface of the glass plate 11 of the glass 100, a rubber attachment portion 153 disposed at a surface of the supporter 152 to which the rubber 156 is attached, and a coupling portion 154 to be coupled with the housing 120.

In this regard, the rubber attachment portion 153 may be formed at an outer frame of the glass holder 151.

In addition, the coupling portion 154 has a bolt B coupling hole 155 to be fixed to the housing 120.

A waterproof bracket 157, which contacts the rubber 156 of the waterproof device 150 to seal the interior of the display apparatus 100, is formed at the housing 120.

The waterproof bracket 157 has a bolt hole 157a which is to be coupled by a bolt B with the coupling portion 154 of the waterproof 150.

Thus, the housing 120, the waterproof device 150, and the glass 110 are fixed by the bolt hole 157a of the waterproof bracket 157 of the housing 120 and the bolt B penetrating the coupling hole 155 of the coupling portion 154 of the glass holder 151.

In addition, the interior of the housing 120 may be sealed by disposing the rubber 156 of the waterproof device 150 on the rear surface of the glass 110 in contact with the waterproof bracket 157 of the housing 120.

In this regard, space between the glass 110 and the housing 120 is completely sealed by compressing the rubber 156 using the waterproof bracket 157.

When the glass plate 111 of the glass 110 of the display apparatus 100 is repaired or replaced, the glass 110 may be separated by removing the bolt B that fixes the housing 120 and the glass 110. Accordingly, A/S may be facilitated, and A/S time may be reduced.

In addition, the waterproof device 150 is disposed between the housing 120 and the back cover 140 as shown in FIG. 15.

In this regard, the waterproof device 150 includes rubber 156 disposed at the back cover 140 and a waterproof bracket 157 formed at the housing 120 to contact the rubber 156.

The rubber 156 may be attached to an edge portion of an inner side wall of the back cover 140.

In addition, the waterproof bracket 157 includes a first waterproof bracket 158 bent from the bottom of the first panel 121 of the housing 120 toward the back cover 140 to contact the rubber 156 and a second waterproof bracket 159 surrounding an outer portion of the first waterproof bracket 158.

Thus, entry of water or dust into the housing 120 may be prevented by the waterproof 150 which is disposed between the housing 120 and the back cover 140. As a result, product durability may be improved.

Referring to FIG. 13, operation of the display apparatus 100 will be briefly described.

In the display apparatus 100 installed outdoors, air introduced from the outside circulates through the housing 120 by the air circulator 130, and thus the temperature inside the housing 120 may be kept within a predetermined range.

External air is introduced through the inlet 141 disposed at a lower portion of the rear surface of the back cover 140, and heat-exchanged air after circulation through the housing 120 is discharged via the outlet 145 disposed at an upper portion of the rear surface of the back cover 140.

In this regard, the inlet 141 includes a first filter 132, and the outlet 145 includes a second filter 136, such that impurities contained in the air introduced and discharged, are filtered.

The air circulator 130 includes a blower fan 133 which generates a suction force and a ventilation force while rotating and a driving motor 134 to drive the blower fan 133 by generating a rotating force.

Thus, air introduced via the inlet 141 circulates through the housing 120 and is discharged to the outside via the outlet 145 by the internal blower fan 133.

The glass 110 is mounted on the front surface of the housing 120, and the back cover 140 is mounted on the rear surface of the housing 120. Since the waterproof units 150 are respectively disposed between the housing 120 and the glass 110 and between the housing 120 and the back cover 140 according to the exemplary embodiment, entry of external moisture or dust into the housing 120 may be prevented.

In addition, the housing 120 may be separated from the glass 110 and from the back cover 140 during, for example, A/S for repair and/or replacement of parts. Accordingly, A/S may be facilitated, and A/S time may be reduced.

As is apparent from the above description, A/S for repair and replacement of a glass plate may be facilitated since the glass plate is detachably mounted on a display, and thus A/S time may be reduced.

In addition, display apparatuses may be classified into two types, display apparatuses provided with a glass plate and display apparatuses not provided with a glass plate, and accordingly the display apparatus may be manufactured to provide a wide range of product groups.

In addition, since parts are dismantled from the display apparatus, A/S for repair and replacement of the parts may be facilitated, and A/S time may be reduced.

In addition, product durability may be improved by improving waterproof properties.

Although a few exemplary embodiments of the present invention have been shown and described, it would be appreciated by those skilled in the art that changes may be made in these exemplary embodiments without departing from the principles and spirit of the invention, the scope of which is defined in the claims and their equivalents.

What is claimed is:

1. A display apparatus comprising:
   a display displaying an image;
   a glass detachably mounted on a front surface of the display, the glass comprising a glass plate and a frame surrounding peripheral portions of the glass plate; and
   a holder provided at the glass, the holder detachably mounting the glass on the display, and the holder comprising a hinge rotatably disposed at the frame,
   wherein the frame comprises a holder installation portion to which the hinge is coupled, the holder installation portion being disposed below an outer surface at a top side of the frame.

2. The display apparatus according to claim 1, wherein the holder further comprises a fixing device extending from the hinge, the fixing device fixing the holder to the display.

3. The display apparatus according to claim 1, wherein the holder installation portion comprises:
   guide grooves disposed outward from an inside of the frame; and
   hinge grooves extending from the guide grooves in a horizontal direction of the frame.

4. The display apparatus according to claim 3, wherein the hinge comprises hinge protrusions coupled with the hinge grooves.

5. The display apparatus according to claim 2, wherein:
   the display comprises a display panel displaying an image, a bezel disposed at an outer peripheral portion of the display panel, and a back case coupled to a rear surface of the display panel; and
   the back case has a first coupling portion to which the holder is fixed.

6. The display apparatus according to claim 5, wherein the fixing device of the holder has a second coupling portion corresponding to the first coupling portion to fix the glass to the display.

7. The display apparatus according to claim 6, wherein the first coupling portion and the second coupling portion comprise a protrusion or a recess.

8. The display apparatus according to claim 4, wherein each of the guide grooves has a diameter greater than a diameter of each of the hinge protrusions, the guide grooves guiding a movement and a rotation of the hinge protrusions, and
   each of the hinge grooves has a diameter equal to a diameter of each of the hinge protrusions, the hinge grooves fixing the holder to the frame.

* * * * *